(12) United States Patent
Taguchi et al.

(10) Patent No.: US 9,468,132 B2
(45) Date of Patent: Oct. 11, 2016

(54) HEAT-RECEIVING DEVICE, COOLING DEVICE, AND ELECTRONIC DEVICE

(71) Applicant: FUJITSU LIMITED, Kawasaki-shi, Kanagawa (JP)

(72) Inventors: Jun Taguchi, Miura (JP); Masaru Kase, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 44 days.

(21) Appl. No.: 14/597,759

(22) Filed: Jan. 15, 2015

(65) Prior Publication Data
US 2015/0124406 A1     May 7, 2015

Related U.S. Application Data

(63) Continuation of application No. PCT/JP2012/070755, filed on Aug. 15, 2012.

(51) Int. Cl.
*H05K 7/20*     (2006.01)
*H01L 23/473*     (2006.01)

(52) U.S. Cl.
CPC ......... *H05K 7/20281* (2013.01); *H01L 23/473* (2013.01); *H05K 7/20209* (2013.01); *H05K 7/20254* (2013.01); *H05K 7/20272* (2013.01); *H01L 2924/0002* (2013.01)

(58) Field of Classification Search
CPC .............. H05K 7/20209; H05K 7/20281; H01L 23/473
See application file for complete search history.

(56) References Cited

U.S. PATENT DOCUMENTS

| | | | | |
|---|---|---|---|---|
| 4,712,158 A | * | 12/1987 | Kikuchi .................... | F28F 3/12 174/16.1 |
| 5,406,807 A | | 4/1995 | Ashiwake et al. | |
| 8,385,068 B2 | * | 2/2013 | Jacobson .............. | H01L 23/473 165/104.33 |
| 8,493,735 B2 | * | 7/2013 | Iijima ...................... | G06F 1/20 361/679.53 |
| 2001/0000880 A1 | * | 5/2001 | Chu ...................... | F25B 39/022 165/263 |
| 2005/0230080 A1 | | 10/2005 | Paul et al. | |

(Continued)

FOREIGN PATENT DOCUMENTS

| JP | 61-222242 | 10/1986 |
|---|---|---|
| JP | 01-123972 | 5/1989 |

(Continued)

OTHER PUBLICATIONS

International Search Report mailed Sep. 11, 2012 in corresponding international application.

(Continued)

*Primary Examiner* — Robert J Hoffberg
(74) *Attorney, Agent, or Firm* — Staas & Halsey LLP

(57) ABSTRACT

A heat-receiving device includes: a plurality of heat receivers into which a refrigerant flows; a series path that comprises a connection path connecting adjacent heat receivers among the plurality of heat receivers, that connects the plurality of heat receivers in series, and into which the refrigerant flows; a bypass path that is not connected to the plurality of heat receivers, and into which the refrigerant flows; a branch path that connects the connection path and the bypass path, and into which the refrigerant flows; and a throttle valve that is provided in the connection path on an upstream side with respect to a connection point of the connection path and the branch path, and that reduces a flow rate at which the refrigerant flows into the connection path as a temperature of the refrigerant flowing into the connection path decreases.

6 Claims, 4 Drawing Sheets

(56) References Cited

U.S. PATENT DOCUMENTS

| | | |
|---|---|---|
| 2011/0110043 A1 | 5/2011 | Iijima |
| 2012/0201001 A1 | 8/2012 | Aoki et al. |
| 2014/0085821 A1* | 3/2014 | Regimbal .......... H05K 7/20236 361/699 |
| 2015/0146376 A1* | 5/2015 | Taguchi ................ H01L 23/473 361/699 |

FOREIGN PATENT DOCUMENTS

| | | |
|---|---|---|
| JP | 05-160310 | 6/1993 |
| JP | 06-004179 | 1/1994 |
| JP | 2001-111279 | 4/2001 |
| JP | 2007-272294 | 10/2007 |
| JP | 2007-533170 | 11/2007 |
| JP | 2007-324498 | 12/2007 |
| JP | 2009-075801 | 4/2009 |
| JP | 2011-103102 | 5/2011 |
| JP | 2012-099694 | 5/2012 |
| WO | 2011/045866 A1 | 4/2011 |

OTHER PUBLICATIONS

Japanese Office Action dated Sep. 29, 2015 in corresponding Japanese Patent Application No. 2014-530415.

* cited by examiner

HEAT-RECEIVING DEVICE, COOLING DEVICE, AND ELECTRONIC DEVICE

CROSS-REFERENCE TO RELATED APPLICATIONS

This application is a continuation application of PCT/JP2012/070755 filed on Aug. 15, 2012 and designated the U.S., the entire contents of which are incorporated herein by reference.

FIELD

The embodiments discussed herein are related to a heat-receiving device, a cooling device, and an electronic device.

BACKGROUND

In some cases, plural heat receivers are arranged in series on a path through which a refrigerant flows. Such a heat receiver into which the refrigerant flows receives heat from a heat-generating part. A technique related to such a heat receiver is disclosed in Japanese Patent Application Publication Nos. 2007-324498, 05-160310, 2007-272294, and 2009-075801.

The refrigerant discharged from the heat receiver on the upstream side flows into the heat receiver on the downstream side. Therefore, the refrigerant that has already received heat from the heat receiver on the upstream side flows into the heat receiver on the downstream side. Thus, as compared with the heat receiving efficiency of the heat receiver on the upstream side, the heat receiving efficiency of the heat receiver on the downstream side might be low.

SUMMARY

According to an aspect of the embodiments, a heat-receiving device includes: a plurality of heat receivers into which a refrigerant flows; a series path that comprises a connection path connecting adjacent heat receivers among the plurality of heat receivers, that connects the plurality of heat receivers in series, and into which the refrigerant flows; a bypass path that is not connected to the plurality of heat receivers, and into which the refrigerant flows; a branch path that connects the connection path and the bypass path, and into which the refrigerant flows; and a throttle valve that is provided in the connection path on an upstream side with respect to a connection point of the connection path and the branch path, and that reduces a flow rate at which the refrigerant flows into the connection path as a temperature of the refrigerant flowing into the connection path decreases.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
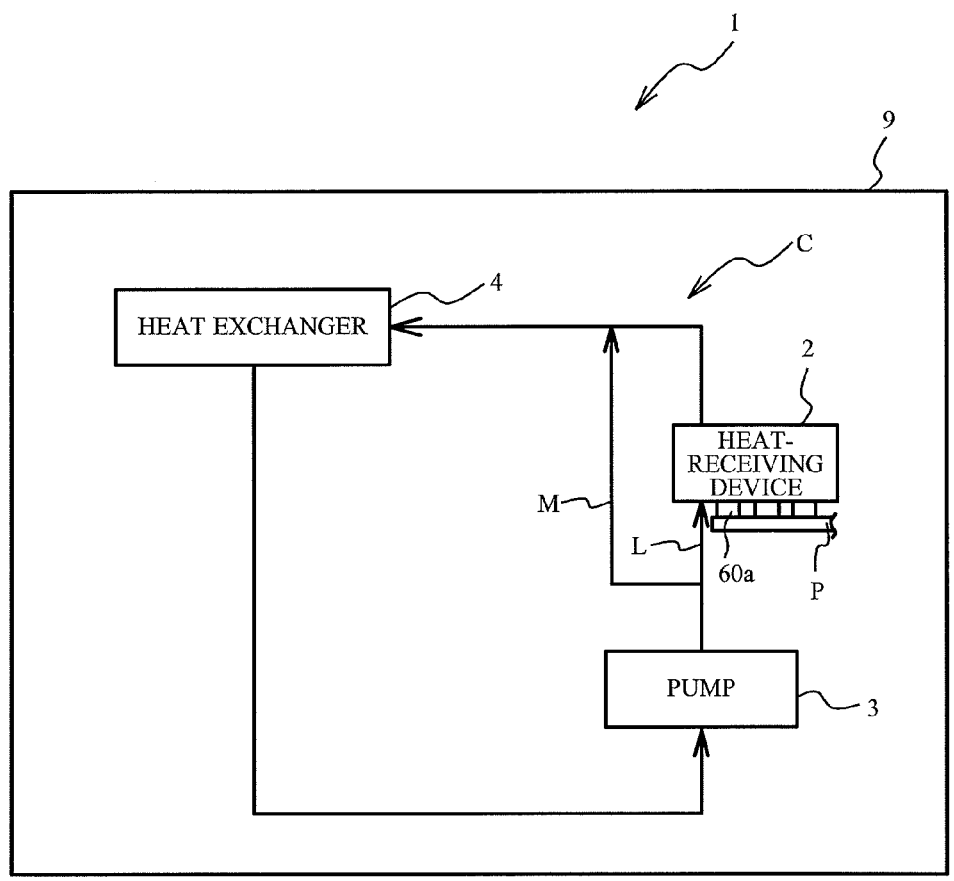
FIG. 1 is a block diagram of an electronic device.

FIG. 1 is a block diagram of an electronic device. The electronic device 1 is an information processing device such as a super computer, a server, a network device, a desktop computer, or a notebook computer. The electronic device 1 includes a cooling device C for cooling heat-generating parts to be described later, and a housing 9 housing the cooling device C.

The cooling device C includes a heat-receiving device 2, a pump 3, a heat exchanger 4, a heat-generating part 60a and the others, and a printed circuit board P. A refrigerant circulates through the cooling system C. The heat-receiving device 2 is provided in contact with the heat-generating part 60a and the others, and transfers heat from the heat-generating parts to the refrigerant. The pump 3 causes the refrigerant to circulate through the heat-receiving device 2 and the heat exchanger 4, in this order. The heat exchanger 4 dissipates heat from the refrigerant to the outside. The heat exchanger 4 may be any one of air-cooled type or a water-cooled type. In a case where the heat exchanger 4 is the air-cooled type, a fan may be provided for cooling the heat exchanger 4. The devices are connected through pipes made of metal and through flexible hoses. The refrigerant is, for example, antifreeze of propylene glycol, but the refrigerant is not limited thereto. Further, the path through which the refrigerant flows branches, at the upstream side of the heat-receiving device 2, from a cooling path L that passes through the heat-receiving device 2, into a bypass path M that does not pass therethrough. At the downstream side of the heat-receiving device 2, the cooling path L and the bypass path M are joined. The cooling path L and the bypass path M are examples of a series path and a bypass path, respectively. These will be described later in detail.

The heat-generating part 60a and the others are, for example, electronic parts such as CPUs or LSIs. The heat-generating part 60a and the others may be plural electronic parts arranged within a single package, or may be single semiconductor chips. The heat-generating part 60a and the others may be any one of parts that generate heat by electric power. The heat-generating part 60a and the others are mounted on the printed circuit board P.

Figure 2:
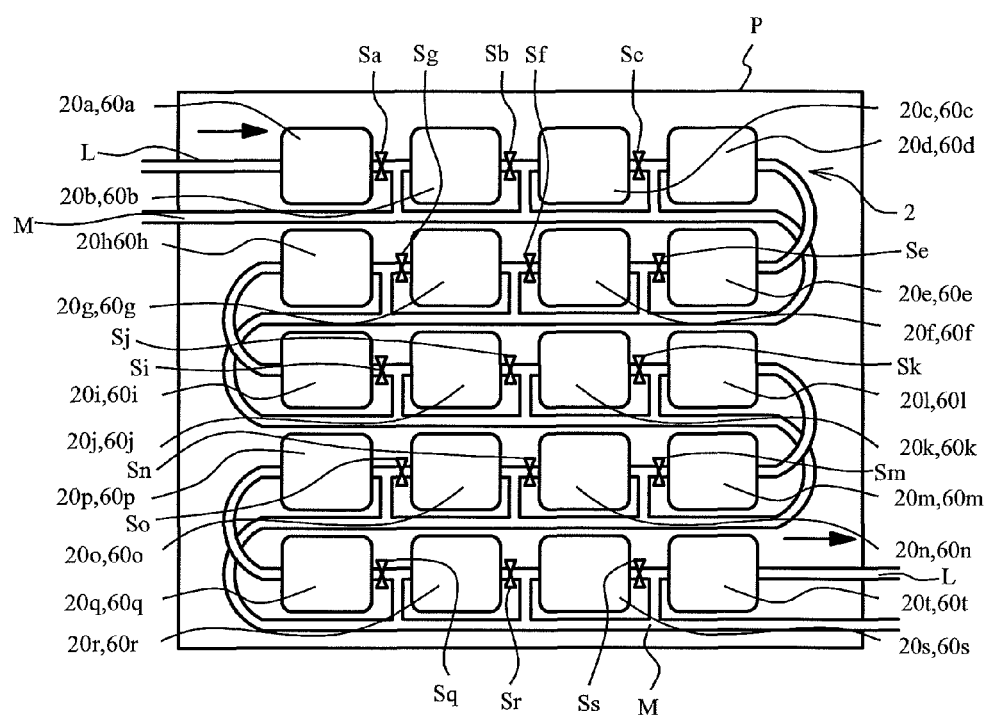
FIG. 2 is an explanatory view of a heat-receiving device.

FIG. 2 is an explanatory view of the heat-receiving device 2. The heat-receiving device 2 includes plural heat receivers 20a to 20t. The heat receivers 20a to 20t are arranged in series from the upstream side to the downstream side. On the printed circuit board P, the plural heat-generating parts 60a to 60t are mounted. The heat receivers 20a to 20t respectively correspond to the heat-generating parts 60a to 60t. The heat receivers 20a to 20t respectively cool the heat-generating parts 60a to 60t. The cooling path L connects the heat receiver 20a to 20t in series. The refrigerant flows into the cooling path L. The bypass path M is arranged in parallel with the cooling path L. The cooling path L and the bypass path M are tubes or the like. The bypass path M is not directly connected to the heat receiver 20a to 20t, but is connected to the cooling path L. A thermostat Sa is provided between the adjacent heat receivers 20a and 20b on the cooling path L. Likewise, thermostats Sb, Sc, Se, Sf, Sg, Si, Sj, Sk, Sm, Sn, So, Sq, Sr, and Ss are respectively provided between the heat receivers 20b and 20c, between the heat receivers 20c and 20d, between the heat receivers 20e and 20f, between the heat receivers 20f and 20g, between the heat receivers 20g and 20h, between the heat receivers 20i and 20j, between the heat receivers 20j and 20k, between the heat receivers 20k and 20l, between the heat receivers 20m and 20n, between the heat receivers 20n and 20o, between the heat receivers 20o and 20p, between the heat receivers 20q and 20r, between the heat receivers 20r and 20s, and between the heat receivers 20s and 20t. Additionally, there is not provided a thermostat between the heat receivers 20d and 20e, between the heat receivers 20h and 20g, between the heat receivers 20l and 20m, and between the heat receivers 20p and 20q.

Figure 3:
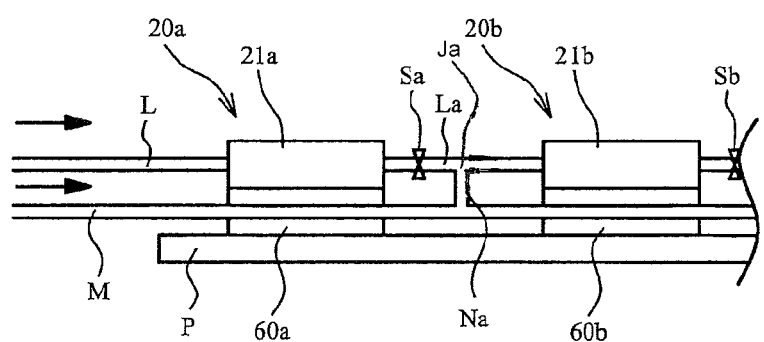
FIG. 3 is a side view partially illustrating the heat-receiving device.

FIG. 3 is a side view partially illustrating the heat-receiving device 2. The heat receivers 20a and 20b are respectively arranged on the heat-generating parts 60a and 60b. The refrigerant flows into the heat receivers 20a and 20b, and the heat receivers 20a and 20b respectively receive heat from the heat-generating parts 60a and 60b, thereby cooling the heat-generating parts 60a and 60b. Also, these arrangements are applicable to the other heat-generating parts 60c to 60t, and the other heat receivers 20c to 20t. The heat receivers 20a and 20b respectively include cases 21a and 21b made of metal such as copper or aluminum. The case 21a is provided within a flow path through which the refrigerant circulates. These arrangements are applicable to the other heat receivers.

Figure 4:
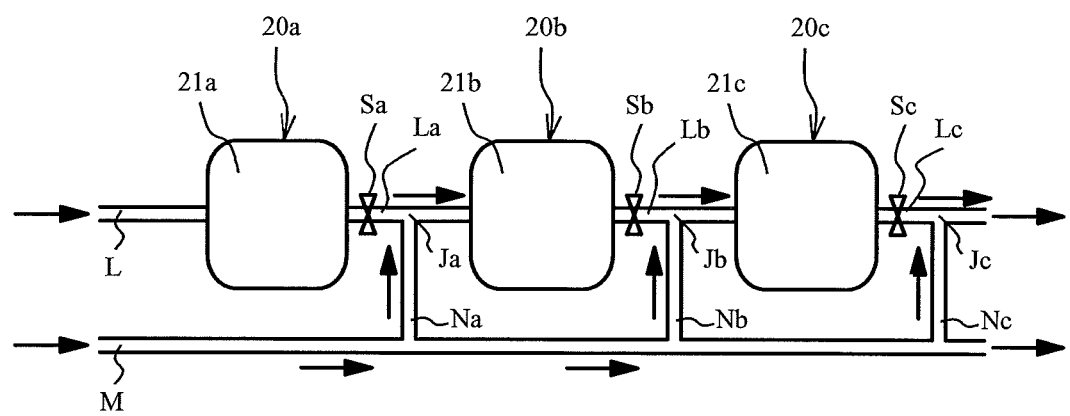
FIG. 4 is a partial view of FIG. 2.

FIG. 4 is a partial view of FIG. 2. As illustrated in FIG. 4, the cooling path L includes relay paths La to Lc. The relay path La connects the adjacent heat receivers 20a and 20b. Likewise, the relay path Lb connects the adjacent heat receivers 20b and 20c. The heat receivers 20a and 20b are an example of first adjacent heat receivers. The heat receivers 20b and 20c are an example of second adjacent heat receivers. The relay path Lc connects the adjacent heat receivers 20c and 20d. In addition, thermostats Sa to Sc are respectively provided in the relay paths La to Lc. Each of the relay paths La to Lc is an example of a connection path. The relay paths La and Lb are examples of first and second connection paths, respectively. A supply path Na is provided for connecting the relay path La and the bypass path M. A supply path Nb is provided for connecting the relay path Lb and the bypass path M. A supply path Nc is provided for connecting the relay path Lc and the bypass path M. Each of the supply paths Na to Nc is an example of a branch path. The supply paths Na and Nb are examples of first and second branch paths, respectively. The refrigerant is supplied from the bypass path M to the relay paths La to Lc through the supply paths Na to Nc.

The thermostat Sa is provided in the relay path La on the upstream side of the joint portion Ja of the relay path La and the bypass path M. The thermostat Sb is provided in the relay path Lb on the upstream side of the joint portion Jb of the relay path Lb and the bypass path M. The thermostat Sc is provided in the relay path Lc on the upstream side of the joint portion Jc of the relay path Lc and the bypass path M. Each of the joint portions Ja to Jc is an example of a connection point. The thermostats Sa and Sb are examples of first and second throttle valves, respectively. The thermostat Sa reduces a flow rate at which the refrigerant flows through the thermostat Sa provided on the rely path La as the temperature of the refrigerant flowing through the thermostat Sa decreases. In other words, the opening degree of the thermostat Sa changes depending on the temperature of the refrigerant flowing through the thermostat Sa. These arrangements are applicable to the other thermostats. As illustrated in FIG. 2, these arrangements are applicable to the other portions on the cooling path L or the bypass path M.

As mentioned above, in the present embodiment, the thermostat Sa, the bypass path M, and the like are provided in addition to the cooling path L. Herein, it is considered that only the cooling path L connecting the plural heat receivers in series is provided without providing the bypass path M, and the thermostat Sa and the others. In this case, the cooling efficiency of the heat receiver on the downstream side is reduced in general. This is because the refrigerant having already received heat from the heat receiver on the upstream side has a high temperature and this high-temperature refrigerant flows into the heat receiver on the downstream side. Therefore, the heat receiving efficiency of the heat receiver on the downstream side tends to be lower than that of the heat receiver on the upstream side. This might cause a variation in the heating efficiency among the heat receivers, so that the heat-generating part cooled by the heat receiver on the downstream side might not be sufficiently cooled.

Next, the case of the present embodiment will be explained. The refrigerant having flowed through the cooling path L flows into the heat receiver 20a. The refrigerant having flowed out of the heat receiver 20a and the refrigerant having flowed from the bypass path M through the supply path Na flow into the heat receiver 20b. Herein, since the refrigerant having flowed through the heat receiver 20a has already received heat from the heat-generating part 60a in the heat receiver 20a, this refrigerant has a high temperature. In contrast, the refrigerant having flowed through the bypass path M does not flow into the heat receiver 20a, so this refrigerant remains at a low temperature. Thus, the refrigerant which has flowed through the heat receiver 20a and which has a high temperature, and the refrigerant which does not flow through the heat receiver 20a and which remains at a low temperature, flow into the heat receiver 20b. Therefore, the temperature of the whole of the refrigerant flowing into the heat receiver 20b is lower than that of the refrigerant flowing out of the heat receiver 20a. Thus, the refrigerant having a low temperature also flows into the heat receiver 20b located on the downstream side with respect to the heat receiver 20a. This suppresses a decrease in the heat receiving efficiency of the heat receiver 20b. As a result, the heat-generating part 60b can be cooled. Likewise, the refrigerant having flowed out of the heat receiver 20b, and the refrigerant not having flowed through the heat receivers 20a and 20b, flow into the heat receiver 20c. This suppresses a decrease in the heat receiving efficiency of the heat receiver 20c. These arrangements are applicable to the other heat receivers.

Additionally, in order to cause the refrigerant to flow from the bypass path M toward the cooling path L even when the thermostat Sa and the others are fully opened, the lengths and the inner diameters of the cooling path L and the bypass path M, the pressure loss of the refrigerant in the flow path of the heat receiver 20a or the like, and the performance of the pump 3 are designed.

Next, the thermostat will be described. For example, when the refrigerant having a comparatively low temperature flows out of the heat receiver 20a, the thermostat Sa reduces the flow rate of the refrigerant flowing out of the heat receiver 20a. This reduces the flow rate of the refrigerant flowing out of the heat receiver 20a through the relay path La. Therefore, as compared with a case of not reducing the flow rate of the refrigerant flowing out of the heat receiver 20a, the flow rate of the refrigerant flowing into the relay path La from the bypass path M increases. This increases the ratio of the refrigerant flowing into the heat receiver 20b from the bypass path M to the refrigerant flowing into the heat receiver 20b. Then, the refrigerant having a low temperature flows into the heat receiver 20b. This suppresses the decrease in the heat receiving efficiency of the heat receiver 20*b* arranged on the downstream side. These arrangements are applicable to the other heat receivers.

Further, for example, when the refrigerant having a comparatively high temperature flows out of the heat receiver 20*a*, the thermostat Sa opens to increase the flow rate of the refrigerant flowing out of the heat receiver 20*a*. This suppresses a further increase in the temperature of the refrigerant caused by receiving heat from the heat receiver 20*a*. Herein, it is considered that the flow rate is reduced by some valve even when the refrigerant having a comparatively high temperature flows out of the heat receiver 20*a*. In this case, when the flow rate of the refrigerant flowing out of the heat receiver 20*a* is reduced, the refrigerant remains in the heat receiver 20*a* for a relatively long time, and the amount of heat received by the refrigerant in the heat receiver 20*a* increases, which might further increase the temperature of the refrigerant. As a result, the heat receiving efficiency of the heat receiver 20*a* might decrease, and the heat-generating parts 60*a* might not be sufficiently cooled. However, in the present embodiment, when the refrigerant having a comparatively high temperature flows out of the heat receiver 20*a*, the thermostat Sa opens to ensure the flow rate of the refrigerant flowing through the relay path La. Accordingly, the cooling ability for the heat-generating parts 60*a* is ensured.

The thermostat Sa is, for example, a wax-pellet type, but may be another type. As for the wax-pellet type thermostat, wax is sealed within a pellet, and a valve is opened and closed by the expansion and contraction of the wax due to heat. It is desirable that the temperature at which the thermostat Sa fully opens is as high as possible within a range in consideration of a reduction in power consumption, a reduction in failure rate, and the like. These arrangements are applicable to the thermostat Sb and the others.

The thermostat Sa and the others are provided in such a way, so that the flow rate of the refrigerant is controlled according to the temperature of the refrigerant flowing through the thermostat Sa. It is thus possible to suppress the decrease in the heat receiving efficiency of the heat receiver on the downstream side, and also possible to suppress the variation in the heat receiving efficiency among the heat receivers.

Additionally, a single heat-generating part may be cooled by plural heat receivers.

Also, an electromagnetic valve may be provided instead of the thermostat, a sensor may be provided for detecting the temperature of the refrigerant flowing out of the heat receiver, and a control circuit may be provided for controlling the opening degree of the electromagnetic valve on the basis of outputs from the sensor. In this case, the opening degree of the electromagnetic valve may be controlled to be smaller as the temperature of the refrigerant flowing out of the heat receiver is lower.

Further, a valve may be other than the thermostat, if it throttles the refrigerant flowing therethrough as the temperature of the refrigerant decreases.

As illustrated in FIG. 4, the heat receivers 20*a* and 20*b* have been described as the first adjacent heat receivers, and the heat receivers 20*b* and 20*c* have been described as the second adjacent heat receivers. However, the present invention is not limited to these arrangements. For example, the heat receivers 20*a* and 20*b* may be the first adjacent heat receivers, and the heat receivers other than the heat receivers 20*a* and 20*b* may be the second adjacent heat receivers. For example, the heat receivers 20*c* and 20*d* are also an example of the second adjacent heat receivers. In this case, the relay path Lc is an example of the second connection path. The supply path Nc is an example of the second branch path. The thermostat Sc is an example of the second throttle valve.

All examples and conditional language recited herein are intended for pedagogical purposes to aid the reader in understanding the invention and the concepts contributed by the inventor to furthering the art, and are to be constructed as being without limitation to such specifically recited examples and conditions, nor does the organization of such examples in the specification relate to a showing of the superiority and inferiority of the invention. Although the embodiment of the present inventions has been described in detail, it should be understood that the various changes, substitutions, and alterations could be made hereto without departing from the spirit and scope of the invention.

What is claimed is:
1. A heat-receiving device comprising:
a plurality of heat receivers into which a refrigerant flows;
a series path that comprises a connection path connecting adjacent heat receivers among the plurality of heat receivers, the series path connects the plurality of heat receivers in series, and into which the refrigerant flows;
a bypass path in parallel with an entirety of the series path, the bypass path is not directly connected to the series path, and into which the refrigerant flows;
at least one branch path that connects the connection path and the bypass path, and into which the refrigerant flows, each of the at least one branch path connects between a respective pair of the adjacent heat receivers and the bypass path; and
at least one throttle valve, each of the at least one throttle value is provided in the connection path on an upstream side with respect to a connection point of the connection path and each of the at least one branch path, and reduces a flow rate at which the refrigerant flows into the connection path as a temperature of the refrigerant flowing into the connection path decreases.
2. The heat-receiving device of claim 1, wherein
the adjacent heat receivers includes:
first adjacent heat receivers, and
second adjacent heat receivers,
the connection path includes:
a first connection path connecting the first adjacent heat receivers, and
a second connection path connecting the second adjacent heat receivers,
the at least one branch path includes:
a first branch path connecting the first connection path and the bypass path, and
a second branch path connecting the second connection path and the bypass path, and
the at least one throttle valve includes:
a first throttle valve provided in the first connection path, and
a second throttle valve provided in the second connection path.
3. The heat-receiving device of claim 1, wherein each of the at least one throttle valve is a thermostat.
4. A cooling device comprising:
a heat-receiving device including;
a plurality of heat receivers into which a refrigerant flows;
a series path that comprises a connection path connecting adjacent heat receivers among the plurality of heat receivers, the series path connects the plurality of heat receivers in series, and into which the refrigerant flows;

a bypass path in parallel with an entirety of the series path, the bypass path is not directly connected to the series path, and into which the refrigerant flows;

at least one branch path that connects the connection path and the bypass path, and into which the refrigerant flows, each of the at least one branch path connects between a respective pair of the adjacent heat receivers and the bypass path; and at least one throttle valve that is provided in the connection path on an upstream side with respect to a connection point of the connection path and each of the at least one branch path, and that reduces a flow rate at which the refrigerant flows into the connection path as a temperature of the refrigerant flowing into the connection path decreases;

a plurality of heat-generating parts, each of the heat receivers is arranged on a respective one of the heat generating parts; and a printed circuit board on which the heat-generating parts are mounted.

5. The cooling device of claim 4, comprising:

a heat exchanger that takes heat from the refrigerant; and a pump that causes the refrigerant to circulate.

6. An electronic device comprising:

a heat-receiving device including;

a plurality of heat receivers into which a refrigerant flows;

a series path that comprises a connection path connecting adjacent heat receivers among the plurality of heat receivers, the series path connects the plurality of heat receivers in series, and into which the refrigerant flows;

a bypass path in parallel with an entirety of the series path, the bypass path is not directly connected to the series path, and into which the refrigerant flows;

at least one branch path that connects the connection path and the bypass path, and into which the refrigerant flows, each of the at least one branch path connects between a respective pair of the adjacent heat receivers and the bypass path; and at least one throttle valve, each of the at least one throttle valve is provided in the connection path on an upstream side with respect to a connection point of the connection path and each of the at least one branch path, and that reduces a flow rate at which the refrigerant flows into the connection path as a temperature of the refrigerant flowing into the connection path decreases;

a plurality of heat-generating parts, each of the heat receivers is arranged on a respective one of the heat generating parts;

a printed circuit board on which the heat-generating parts is mounted; and a housing that houses the heat-receiving device, the heat-generating parts, and the printed circuit board.

* * * * *